(12) United States Patent
Strahm et al.

(10) Patent No.: US 11,817,517 B2
(45) Date of Patent: Nov. 14, 2023

(54) PHOTOVOLTAIC DEVICE AND METHOD FOR MANUFACTURING THE SAME

(71) Applicant: MEYER BURGER (GERMANY) GMBH, Hohenstein-Ernstthal (DE)

(72) Inventors: Benjamin Strahm, Giez (CH); Damien Lachenal, Cortaillod (CH); Derk Bätzner, Ins (CH)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 56 days.

(21) Appl. No.: 17/623,811

(22) PCT Filed: Jul. 3, 2020

(86) PCT No.: PCT/EP2020/068903
§ 371 (c)(1),
(2) Date: Dec. 29, 2021

(87) PCT Pub. No.: WO2021/018517
PCT Pub. Date: Feb. 4, 2021

(65) Prior Publication Data
US 2022/0246780 A1  Aug. 4, 2022

(30) Foreign Application Priority Data

Jul. 26, 2019 (EP) ..................... 19188562

(51) Int. Cl.
*H01L 31/077* (2012.01)
*H01L 31/20* (2006.01)

(52) U.S. Cl.
CPC .......... *H01L 31/077* (2013.01); *H01L 31/202* (2013.01)

(58) Field of Classification Search
None
See application file for complete search history.

(56) References Cited

U.S. PATENT DOCUMENTS

2013/0164878 A1* 6/2013 Cousins ............. H01L 31/1804
257/E31.13
2014/0020753 A1* 1/2014 Goto .................. H01L 31/0682
438/96

(Continued)

FOREIGN PATENT DOCUMENTS

CN 209104182 U 7/2019
EP 2 782 144 9/2014

(Continued)

OTHER PUBLICATIONS

International Search Report for PCT/EP2020/068903 dated Aug. 21, 2020, 4 pages.

(Continued)

*Primary Examiner* — Eli S Mekhlin
(74) *Attorney, Agent, or Firm* — NIXON & VANDERHYE (57) ABSTRACT

Disclosed is an interdigitated back contact photovoltaic device that includes a first patterned silicon layer situated on an intrinsic layer, and having the same type of doping as the one of the substrate. First charge collection portions are deposited on predetermined areas of the intrinsic layer, and include each an amorphous layer portion situated between the predetermined areas and the at least partially nano-crystalline layer portions. The amorphous layer portions have a larger width than the width of the nano-crystalline layer portions. On top if the first patterned silicon layer, a second nano-crystalline silicon layer is deposited that has a doping of a second type being the other of the p-type doping or the n-type doping with respect to the doping-type of the first patterned silicon layer.

20 Claims, 9 Drawing Sheets

(56) References Cited

U.S. PATENT DOCUMENTS

| | | |
|---|---|---|
| 2014/0295613 A1 | 10/2014 | O'Sullivan |
| 2016/0079463 A1 | 3/2016 | Chen et al. |
| 2018/0309010 A1 | 10/2018 | Paviet-Salomon et al. |
| 2019/0189813 A1 | 6/2019 | Tracy et al. |

FOREIGN PATENT DOCUMENTS

| | | |
|---|---|---|
| EP | 1 519 422 | 5/2018 |
| EP | 3 371 833 | 9/2018 |
| WO | 2006/077343 A1 | 7/2006 |
| WO | 2017/076832 | 5/2017 |

OTHER PUBLICATIONS

Written Opinion of the ISA for PCT/EP2020/068903 dated Aug. 21, 2020, 7 pages.

Das et al., "The role of back contact patterning on stability and performance of Si IBC heterojunction solar cells", Proceedings of the 34$^{th}$ IEEE Photovoltaic Specialist Conference, 2014, pp. 590-593.

Mingirulli et al., "Efficient interdigitated back-contacted silicon heterojunction solar cells", Phys. Status Solidi-Rapid Research Letter 5, No. 4, Apr. 2011, pp. 159-161.

\* cited by examiner

Microscope Picture of Part of a Structure 2

PHOTOVOLTAIC DEVICE AND METHOD FOR MANUFACTURING THE SAME

This application is the U.S. national phase of International Application No. PCT/EP2020/068903 filed Jul. 3, 2020 which designated the U.S. and claims priority to EP 19188562.3 filed Jul. 26, 2019, the entire contents of each of which are hereby incorporated by reference.

TECHNICAL FIELD

The present invention relates to the field of photovoltaic devices. More particularly, it relates to a photovoltaic device with back-contacts being of the interdigitated back contact (IBC) type in which the collecting material is patterned, resulting in a device comprising a tunnel junction on the back of the device. The invention also relates to a method for producing this photovoltaic device.

A particular advantageous application of the present invention is for the production of highly efficient photovoltaic cells intended for generating electrical energy, but the invention also applies, more generally, to any similar device in which an incoming radiation is converted into an electrical signal, such as photodetectors and ionizing radiation detectors.

BACKGROUND OF THE INVENTION

Interdigitated back-contact silicon heterojunction solar cells (IBC-SHJ), while being highly efficient, present difficulties due to their highly complex processing. Indeed, the realization of IBC-SHJ devices requires patterning the rear a-Si:H layers and TCO/metal stacks into interdigitated combs, with a very high accuracy. Most of the techniques known from the state-of-the-art rely on the use of complex and costly processes. Examples are described in for example the following papers:

*Efficient interdigitated back-contacted silicon heterojunction solar cells*, N. Mingirulli et al, Phys. status solidi-Rapid Res. Lett., vol. 5, nr. 4, pp. 159-161, April 2011;
*The role of back contact patterning on stability and performance of Si IBC heterojunction solar cells*, U. K. DAS et al., Proceedings of the 40the IEEE Photovoltaic Specialist Conference, 2014, vol. 1;

A document WO 2006/077343 describes a typical example of a device requiring two patterning steps, but it needs an insulating layer between the n- and p-fingers which makes the process complex.

Regardless of the chosen patterning techniques, all the approaches of prior art require to pattern both the electron- and the hole-collecting structures. This makes the realization of all existing IBC-SHJ devices lengthy, delicate, and thus strongly cost-ineffective.

To tackle this problem, it has been proposed to pattern only a first silicon layer which is an n-doped layer or a p-doped layer, i.e. an electron- or a hole-collecting structure. A second silicon layer of a second type is, in these devices, deposited on top of the patterned charge-collecting structures. The resulting device is called a "tunnel junction IBC-HJT device".

In exemplary realizations of the device the first type of the charge collecting structure is a patterned n-type a-Si:H layer, and the patterning of that layer provides a charge collecting structure In such a realization, a p-type a-Si:H layer covers both the intrinsic a-Si:H buffer layer as well as said charge collecting structure. Compared to techniques wherein the two types of charge collectors have to be patterned, such a process flow results in a simpler and thus cost-effective process, because the second silicon layer, which is of the opposite doped type with respect to the doped type of said first silicon layer, forms a self-aligned collecting structure. Although the fabrication process of such devices is simpler than the ones in which both of the charge carrier collecting finger types are structured, the efficiencies are lower, such as for example in the case of the device described in EP 1519422.

Figure 1:
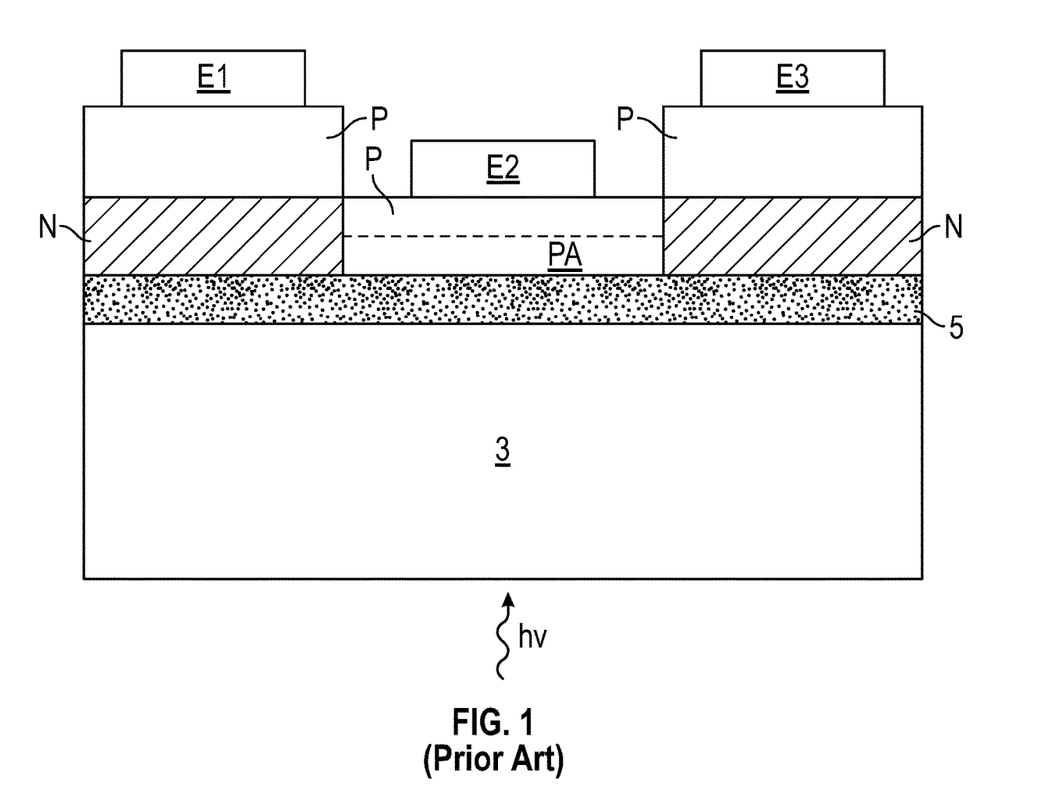
FIG. 1 is a schematic cross-section view of a prior art tunnel IBC-HJT photovoltaic device in which only one type of charge collecting structures are patterned and in which a layer of the other type covers both the patterned charge collecting structure and its interstices, and having different properties on said patterned structures and in said interstices.

The design of the device described in EP3371833A1, and illustrated in FIG. 1, proposes a solution to the problem that the tunnel layer is homogeneous and having the same properties when situated on the intrinsic buffer layer and on the patterned hole-collecting fingers. EP3371833A1 describes an interdigitated back-contact silicon heterojunction solar cells wherein a first silicon layer of a first type is structured and forms charge collecting islands (N) also called charge collecting "fingers" and is a substantially microcrystalline structure but comprising an amorphous portion in contact with the buffer layer.

In the device of EP3371833A1 a single layer is provided on said charge collecting islands and in said interstices (I) between said charge collecting islands. The layer (P in FIG. 1) comprises an amorphous portion (PA) in said interstices (I), in contact with the amorphous intrinsic layer 5, and has therefor different properties when present on the microcrystalline structures or on the amorphous intrinsic layer that is situated between these structures. Electrodes (E1-E3) like contact pads or contact fingers are realized on top of the tunnel layer P.

In order to reach the highest performance, a tunnel IBC solar cell needs to exhibit very low contact resistance for both the electron and hole contacts. The tunnel junction concept, as presented in the document EP3371833A1 relies on the growth differentiation of the silicon (p) layer between the hole collector (3-5-P-E2 in FIG. 1) and the electron collectors (3-5-N-P-E1, 3-5-N-P-E3 in FIG. 1).

Typically, the silicon (p) layer grows initially more amorphous on the hole collector while growing immediately nano-crystalline on the electron collector. This is due to the fact that the initial growth of the silicon layer in zones of the hole collecting area is realized on the amorphous silicon layer 5, whereas in zones of the electron collecting structures growth happens on an already nano-crystalline silicon layer (N in FIG. 1).

The device illustrated in FIG. 1 illustrates the relatively important thickness of the amorphous p-layer (PA) of the device described in document EP3371833A1. The asymmetry of the p-layer allows to reach very low contact resistance for the electron collector stack (3/5/N/P/E1 or 3/5/N/P/E3 in FIG. 1), typically 20-50 mOhm·cm2, while the emitter or hole collector stack (3/5/PA/P/E2 in FIG. 1) resents a higher contact resistance, typically 50-300 mOhm·cm$^2$, due to its partially amorphous nature. The strong difference of electrical conductivity between an amorphous and a nano-crystalline layer disables or strongly reduces the electrical lateral conduction between the hole and electron contacts, hence preventing short-circuit between both type contacts. Typical electrical conductivities for a n-type doped amorphous layer is in the range of 0.001 S/cm to 0.01 S/cm. A typical conductivity for the n-type doped nano-crystalline layer is in the range of 1 S/cm to 100 S/cm.

The drawback of such a structure described in document EP3371833A1 is the limitation of the hole contact resistance to reach very low values, as it needs to remain partially amorphous to prevent the lateral shunt. In order to reach a low contact resistance, especially at the interface between p-layer and the contact pads for the hole contact, more aggressive plasma conditions should be used to reduce or completely avoid the amorphous phase of the silicon (p) layer. The higher nano-crystallinity of this layer, giving advantageous low contact resistance to the contact pads, at the same time shows a higher lateral conductivity. The higher lateral conductivity increases the chance for charges that should be collected at one type contact to travel to the other type contact region where they can recombine with the opposite type of charges and hence getting lost. A solar cell device would hence show a lower shunt resistance and cell efficiency even with the advantageous lower contact resistance.

It is therefore necessary to find a solution to prevent the low shunt resistance between both contacts while exploiting the full potential of low contact resistance for both type contacts.

A tunnel junction is a barrier, such as a thin insulating layer or electric potential between two electrically conducting materials. Electrons or holes pass through the barrier by the process of quantum tunneling providing some probability to pass through the barrier. Usually a tunnel junction in PV cells uses degenerated and heavily doped semiconductors to facilitate the direct recombination of electron and hole carriers. The depletion region is very thin (nanometer range) allowing the transport from one side of the junction to the other side. Consequently, when creating an IBC based on the tunnel junction proposed by the document EP3371833A1, a tunnel junction is formed all around the first type doped structures (N in FIG. 1), including substantially straight side edges, which prevent using a highly nano-crystalline layer as discussed before.

SUMMARY OF THE INVENTION

The present invention relates to a photovoltaic device which allows to alleviate the disadvantages of the prior art. In particular the invention allows to use, contrarily to prior art devices, a highly nano-crystalline layer deposited on structured first type doped charge collectors such as structured electron or hole charge collectors.

Accordingly the present invention relates to a photovoltaic device photovoltaic device being an interdigitated back contact (IBC) photovoltaic device comprising:
   a silicon-based substrate being of p-type or n-type doping and having a first face defining a X-Y plane;
   an intrinsic amorphous silicon layer a-Si:H(i) situated on said first face;
   a first patterned silicon layer situated on said intrinsic layer, said first silicon layer being of p-type or n-type doping,
   said first patterned silicon layer comprising interstices between charge collection portions that comprise each second portions of an at least partially nano-crystalline silicon layer at their side away from said silicon-based substrate.
   a second nano-crystalline silicon layer being situated on said charge collection portions, and on said interstices, and having another type of doping than the doping type of said patterned silicon layer The charge collection portions comprise each an amorphous layer portion situated between said intrinsic layer and said second portions, said amorphous layer portions having, in at least one of its cross sections parallel to said X-Y plane, and in any radial direction, a largest width that is greater than any width of said second portions, said amorphous layer portions and said second portions (2b) being basically centered to each other.

In an embodiment the largest width of amorphous layer portions is at least 10% larger than said any width of said second portions.

In an embodiment said amorphous layer has a height between 1 nm and 25 nm, and wherein the height of said first charge collection portions is between 25 nm and 100 nm.

In an embodiment said first patterned silicon layer and/or said second nano-crystalline silicon layer includes oxygen and/or carbon.

In an embodiment said amorphous layer and/or said second portions comprise oxygen (O) and/or carbon (C).

In an embodiment said second nano-crystalline silicon layer has a crystalline phase above 50%.

The invention is also achieved by a method for manufacturing of a photovoltaic device as described and comprises the steps (a-d) of:
   a. providing a silicon-based substrate having an n-type or a p-type doping and comprising an intrinsic amorphous a-Si:H(i) layer situated on said first face;
   b. realizing on predetermined areas of said intrinsic layer, a first deposition of an n-type or p-type amorphous silicon layer, so as to create a patterned amorphous layer comprising a plurality of distinct and separated amorphous layer islands;
   c. realizing on each of said amorphous layer islands a second deposition of a second nano-crystalline layer having the same doping type as said amorphous layer, said second deposition being different than said first deposition, so as to create on top of each of said amorphous layer islands, said second nano-crystalline layer portions forming with said amorphous layer islands a plurality of charge collection portions, said amorphous layer portions having, for any of its cross section parallel to said X-Y plane, a first projected area on said X-Y plane that is greater than a second projected area, on said X-Y plane, of said second nano-crystalline layer;
   d. realizing a single nano-crystalline silicon layer on said charge collection portions and on interstices between said charge collection portions, said single nano-crystalline silicon layer having a different doping type than the doping type of said charge collection portions.

In an embodiment said amorphous silicon layer and said second nano-crystalline layer are both deposited by using the same mask.

In an embodiment the deposition of the amorphous silicon layer and said second nano-crystalline layer is made by using two different masks, said first deposition being made by using a first mask having larger openings than the second mask used said second deposition.

In an embodiment said first and second deposition steps are made by using the same mask and wherein during said first deposition the mask is not in contact with said substrate and wherein during said second deposition step the mask is in contact with said substrate providing first charge collection portions that comprise amorphous layer portions that are wider than said second nano-crystalline layer portions.

In an embodiment at least one mask to deposit said amorphous silicon layer and/or said second nano-crystalline layer is a mechanical mask made of INVAR or stainless steel.

In an embodiment said first and second deposition steps are made using a single mask having substantially conical openings to provide different sized patterns of said amorphous silicon layer and/or said second nano-crystalline layer when using different type of deposition parameters such as gas phase density, temperature, gas mixture, reactive precursor generation or a combination thereof.

BRIEF DESCRIPTION OF THE DRAWINGS

The present invention will now be described in reference to the enclosed drawings where.

DETAILED DESCRIPTION

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to the practice of the invention.

It is to be noticed that the term "comprising" in the description and the claims should not be interpreted as being restricted to the means listed thereafter, i.e. it does not exclude other elements.

Reference throughout the specification to "an embodiment" means that a particular feature, structure or characteristic described in relation with the embodiment is included in at least one embodiment of the invention. Thus appearances of the wording "in an embodiment" or, "in a variant", in various places throughout the description are not necessarily all referring to the same embodiment, but several. Furthermore, the particular features, structures or characteristics may be combined in any suitable manner, as would be apparent to a skilled person from this disclosure, in one or more embodiments. Similarly, various features of the invention are sometimes grouped together in a single embodiment, figure or description, for the purpose of making the disclosure easier to read and improving the understanding of one or more of the various inventive aspects. Furthermore, while some embodiments described hereafter include some but not other features included in other embodiments, combinations of features if different embodiments are meant to be within the scope of the invention, and from different embodiments. For example, any of the claimed embodiments can be used in any combination. It is also understood that the invention may be practiced without some of the numerous specific details set forth. In other instances, not all structures are shown in detail in order not to obscure an understanding of the description and/or the figures.

The wording cross section in the document is defined as a horizontal cross section, meaning a cross section in a X-Y plane parallel to the plane of the substrate. The wording vertical means here perpendicular to the substrate. A vertical cross section is a cross section in a plane that comprises the vertical axis Z that is orthogonal to the substrate. X-Z and Y-Z planes define vertical planes that are orthogonal to the substrate. Horizontal planes are X-Y plane that are parallel to the substrate. A radial direction means a direction defined in a horizontal cross section, so defined also in a horizontal plane. A lateral direction is defined in an X and/or Y direction in a horizontal plane. A width is defined as a width of a structure a cross a virtual line in a horizontal cross section, said width is also defined as a diameter.

Thicknesses are defined herein as thicknesses in the vertical direction, i.e. in the direction of the Z-axis.

Herein first charge collecting structures 2' are defined as structures that are configured to collected positive or negative charges when the device is in operation. Such charges may be electrons or holes. Charges of the opposite sign are collected, in operation, in between, i.e. through interstices 2" of said first charge collecting structures 2'.

It has been found that, to solve the problem as described in the prior art section, a second layer 4 can be still deposited as a highly nano-crystalline layer, when changing the shape of the charge collecting structures 2 of the other type contact. For example, a highly nano-crystalline layer 4 of the p-type may be deposited over and between the n-type charge collecting structures 2', or a fully highly nano-crystalline layer 4 of the n-type may be deposited over and between the p-type charge collecting structures 2'. Said highly nano-crystalline layer 4 is a continuous layer, i.e. a layer having no apertures. The new design of the charge collecting structures 2' are realized by depositing first structure portions 2a, defined also as an amorphous layer portion 2a, having an amorphous type composition. On top if these first structure portions 2a, smaller second structure portions 2b are deposited, having a nano-crystalline type composition, and are also defined as second nano-crystalline layer portions 2b. So, said first structure portions 2a are larger than said second structure portions 2b. These second structures portions 2b are preferably centered on said first structures portions 2a.

The new design of structures 2 giving a new so called separating zone 20 that serves to laterally separate the contact zones 10 and 30. These separating zones 20 guarantee a high shunt resistance between the different type contacts 10, 30 even when using a highly nano-crystalline layer 4.

Different embodiments will now be described.

Figure 2:
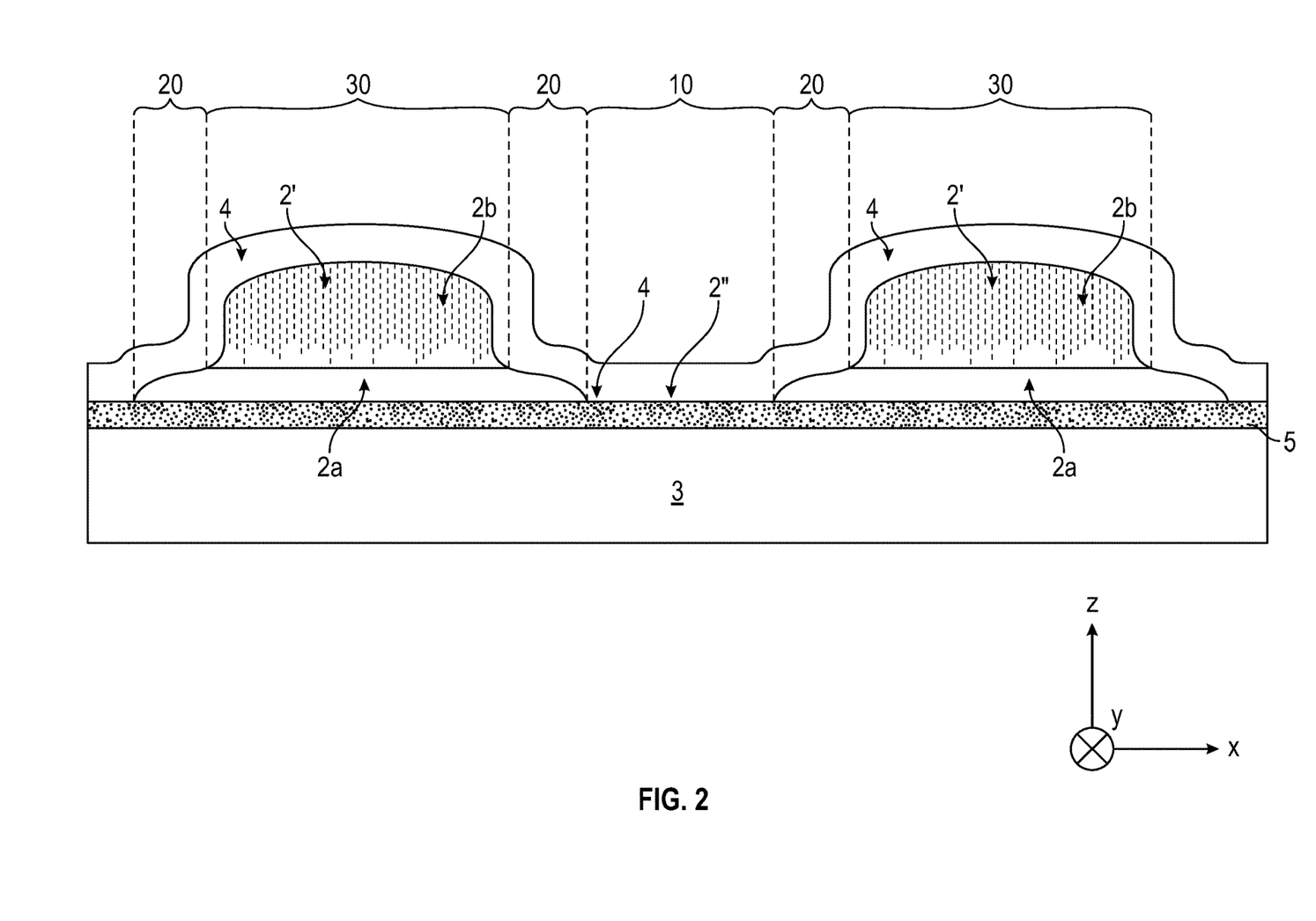
FIG. 2 is a schematic cross-section view of a photovoltaic device of the invention illustrating the different contact zones and the form of an amorphous island of an amorphous patterned layer in contact with an intrinsic layer situated on top of a substrate. The FIG. 2 illustrates also that first charge collecting structures are composed of a large amorphous portion and a less wide nano-crystalline portion. The FIG. 2 illustrates also interstices of said amorphous patterned layer, through which second charge types, opposite to first charges, are transmitted to an electrode that is not illustrated

The photovoltaic device 1 of the invention is an interdigitated back contact (IBC) photovoltaic device and comprises:
- a silicon-based substrate 3 having a p-type or n-type doping and having a first face 3a that defines a X-Y plane and a vertical Z direction orthogonal to said X-Y plane;
- an intrinsic amorphous a-Si:H(i) layer 5 situated on said first face 3a, defining predetermined areas 5a as illustrated in FIG. 2;
- a first patterned silicon layer 2, situated on said intrinsic layer 5, intrinsic, said first patterned silicon layer 2 comprising interstices 2" between said first charge collection portions 2', said first charge collection portions 2' comprising a first part layer 2a and a second part layer 2b.
- a second nano-crystalline silicon layer 4 situated on said first charge collection portions 2' and said interstices 2", said second silicon layer 4 having a doping of another type than said first patterned silicon layer 2,
- electrically conducting pads, not illustrated in the figures, situated on said second nano-crystalline silicon layer 4.

As apparent in for example FIG. 2 said interstices 2" are apertures in the first patterned silicon layer 2, realized by the deposition process as further described. The first part layer 2a has an amorphous structure being deposited directly on top of the intrinsic layer 5 and the second part 2b is deposited on top of the first part layer 2a and has a nano-crystalline structure;

The essential aspect of the invention is that said amorphous layer portions 2a have, in at least one of its cross sections parallel to said X-Y plane, and in any radial direction in that cross section, a dimension L2a that is greater than the dimension L2b of said nano-crystalline layer portions 2b. The nanocrystalline layer portions 2b being basically centered to the amorphous portions 2a and by that a part of layer 2a is jutting out along the border of the first charge collecting portions 2' defining an amorphous/nanocrystalline interface between amorphous layer 2a and nanocrystalline layer 4 leading to a so called separation zone 20. This separation zone 20 separating contact zones 10 of one type from contact zones 30 of another type. The following combinations are possible:
- an n-type substrate 3 and n-type first patterned silicon layer 2 and p-type second nano-crystalline silicon layer 4, which is a preferred embodiment;
- an n-type substrate 3 and p-type first patterned silicon layer 2 and n-type second nano-crystalline silicon layer 4;
- a p-type substrate 3 and n-type first patterned silicon layer 2 and p-type second nano-crystalline silicon layer 4;
- a p-type substrate 3 and p-type first patterned silicon layer 2 and n-type second nano-crystalline silicon layer 4.

The particular shaped first patterned silicon layer 2 of the invention provides a surprising effect that is the essence to solve the problems related to devices such as described in the document EP 3371833A.

To distinguish the above used description of an amorphous silicon layer and a nano-crystalline silicon layer, these terms are now defined.

An amorphous silicon layer is to be understood as a non-orderly, randomly interlinked silicon structure where bindings not linked to neighboring silicon atoms are typically saturated by hydrogen atoms. The wording amorphous layer should also include amorphous silicon networks with near range orderly structures that are in the range of several atoms.

A nano-crystalline silicon layer is considered as a layer containing nanometer sized silicon crystals, embedded in a hydrogenated amorphous silicon based matrix. The nanometer sized crystals having a size between several nm (>3 nm) up to several 100 nm (<500 nm). When depositing a nano-crystalline layer out of a gas-phase it can show an amorphous nucleation layer that starts to get more of a crystalline nature with increasing layer thickness, by either a higher density of nano-crystals and/or bigger sized nano-crystals.

In most practical cases, typically in embodiments such as the ones of FIGS. 2-8, said amorphous layer portions 2a have, in all of its cross sections parallel to said X-Y plane, and in any radial direction in that cross section, a width that is greater than the width of said nano-crystalline layer portions 2b. In most practical cases, the largest width of the amorphous layer portions 2a will be the width at the interface with the buffer layer 5.

Figure 3:
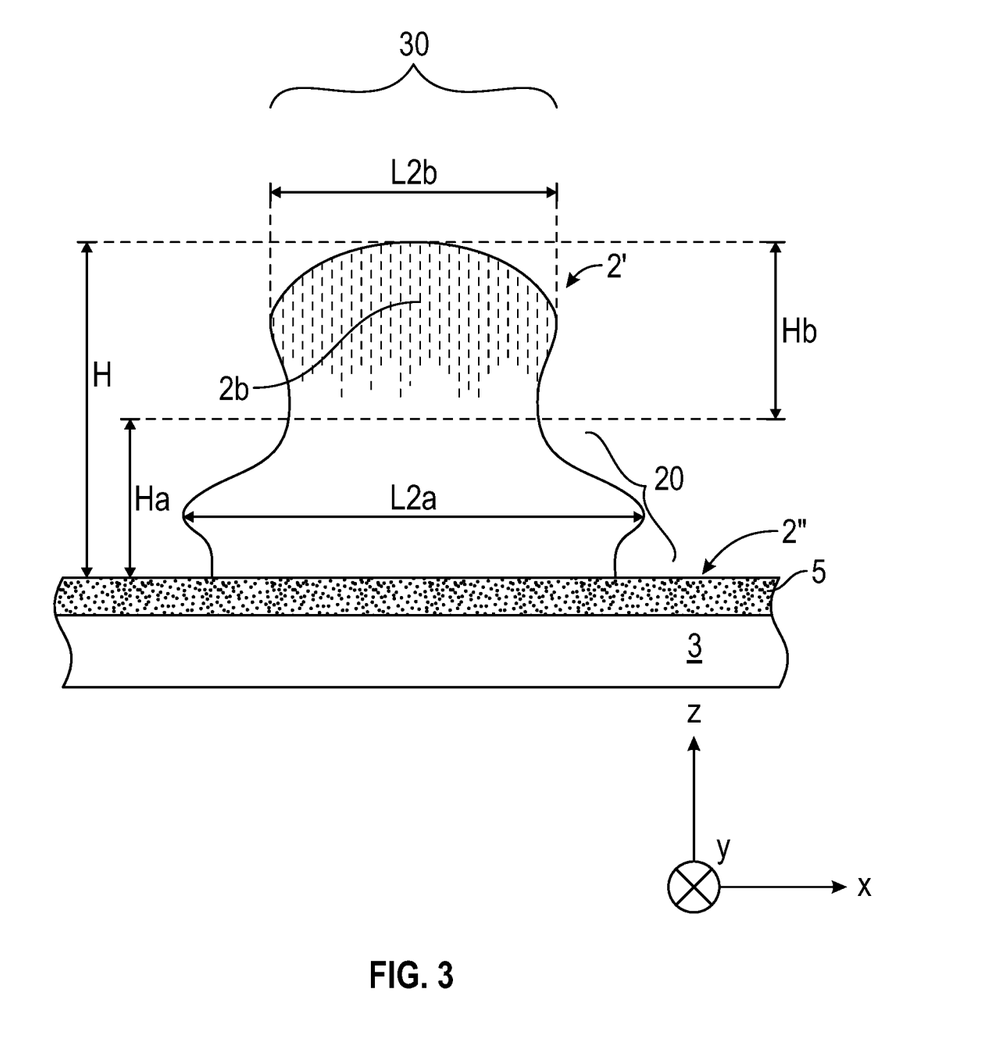
FIG. 3 illustrates an embodiment of a charge collecting structure of the device of the invention.
Figure 4:
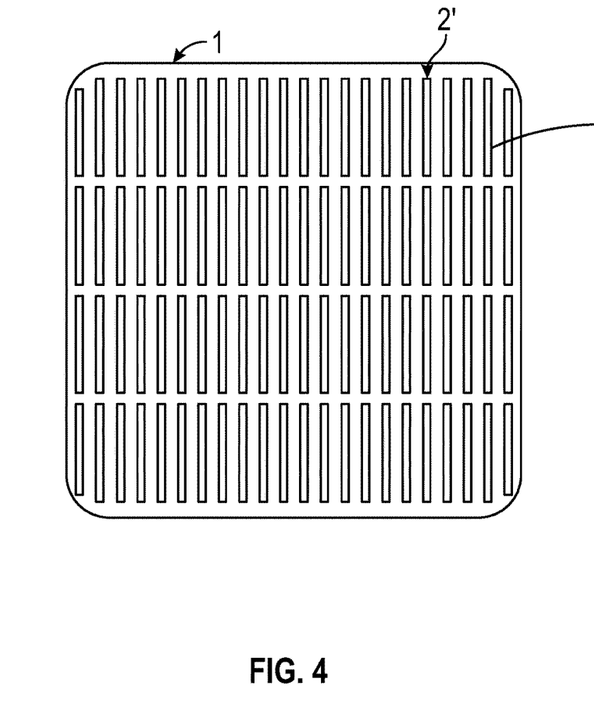
FIG. 4 illustrates a top view on the back side of an IBC-SHJ of the invention.
Figure 5:
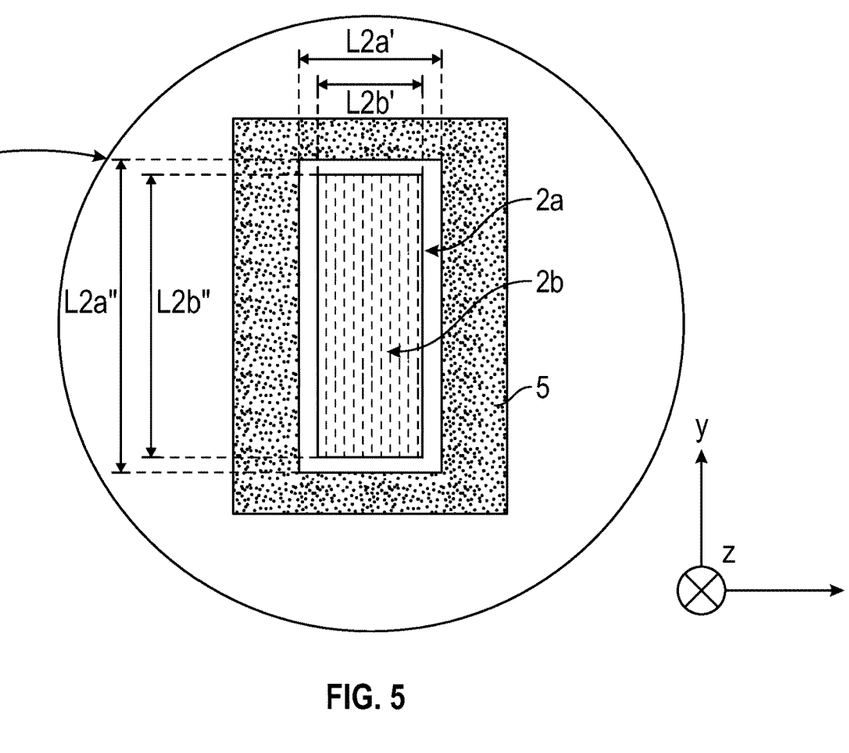
FIG. 5 illustrates an enlarged portion of the top view of FIG. 4 on the back side of an IBC-SHJ of the invention
Figure 6:
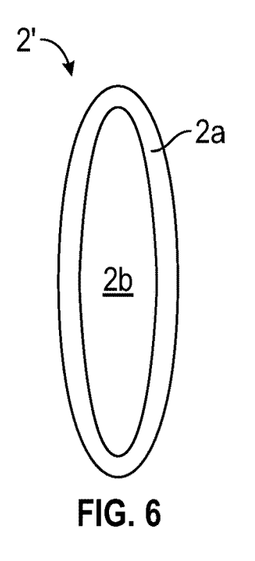
FIG. 6 to 10 illustrate different embodiments of charge collecting structures of the invention and more precisely possible forms of the contact surface between amorphous islands and a second nano-crystalline layer.
Figure 7:
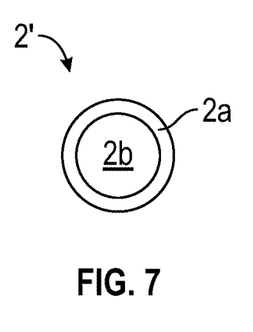
Figure 8:
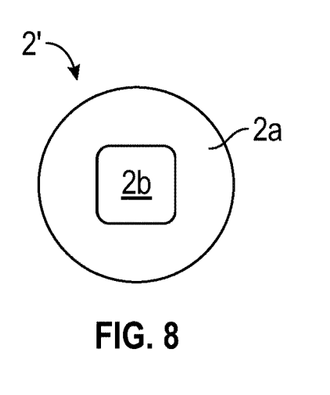
Figure 9:
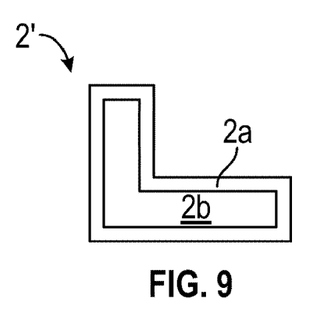
Figure 10:
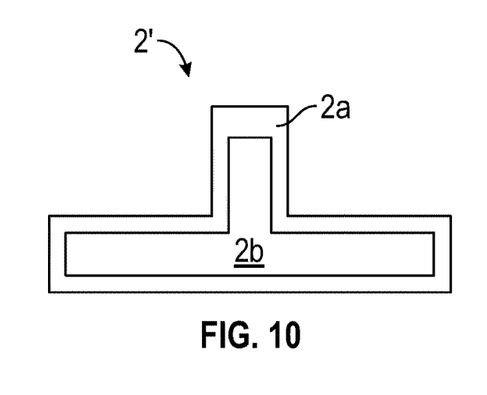

In variants, said first charge collection portions 2' may have a vertical cross section as illustrated in FIG. 3. Such cases may be described generally as follows: an amorphous layer portion 2a has a greatest width L2a that is greater than the greatest width L2b of said partially nano-crystalline layer 2b. The first charge collection portions 2' may have any shape defined in any plane parallel to said X-Y plane. Horizontal cross sections of first charge collection portions 2' may have linear shapes or circular shapes.

In the present invention, the particular structure of the charge collecting structure 2 comprising an amorphous portion 2a and a nano-crystalline portion 2b, and more precisely creating separation zones 20 between the first type contacts 30 and second type contacts 10, allows preventing a lateral shunt when using a highly nano-crystalline second layer 4. In a preferred embodiment the first patterned silicon layer 2 is of the n-type and the second nano-crystalline silicon layer 4 is of the p-type.

Figure 11:
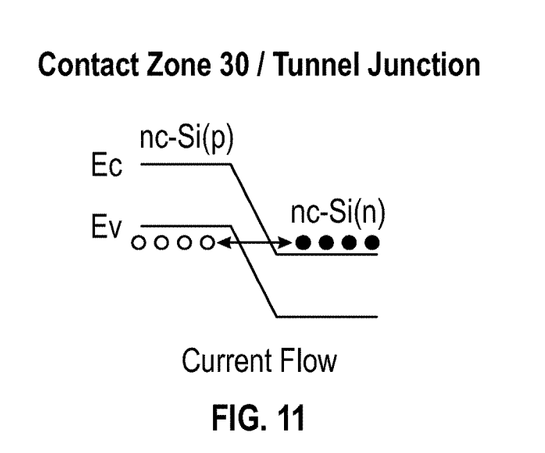
FIG. 11 illustrates the energy level of a tunnel junction formed by a structured charge collecting structure.
Figure 12:
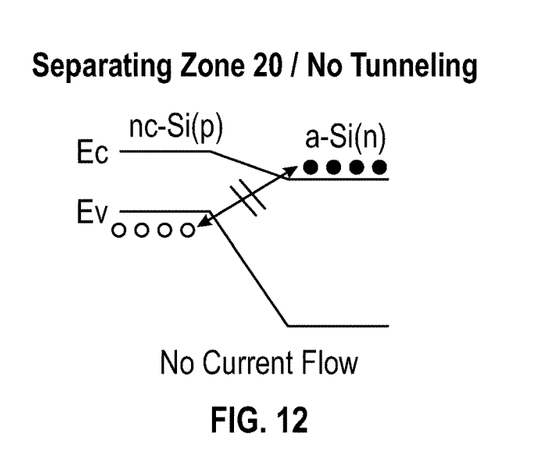
FIG. 12 illustrates the energy level of a non-tunneling separating zone.
Figure 13:
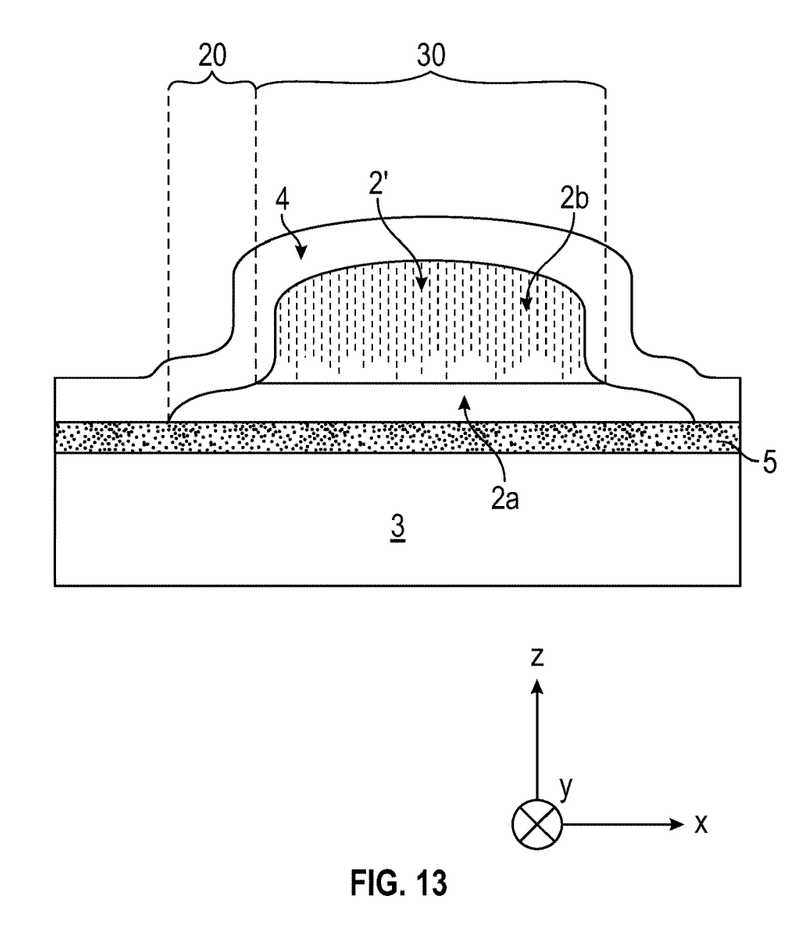
FIG. 13 illustrates a cross section of a charge collecting structure of the invention.
Figure 14:
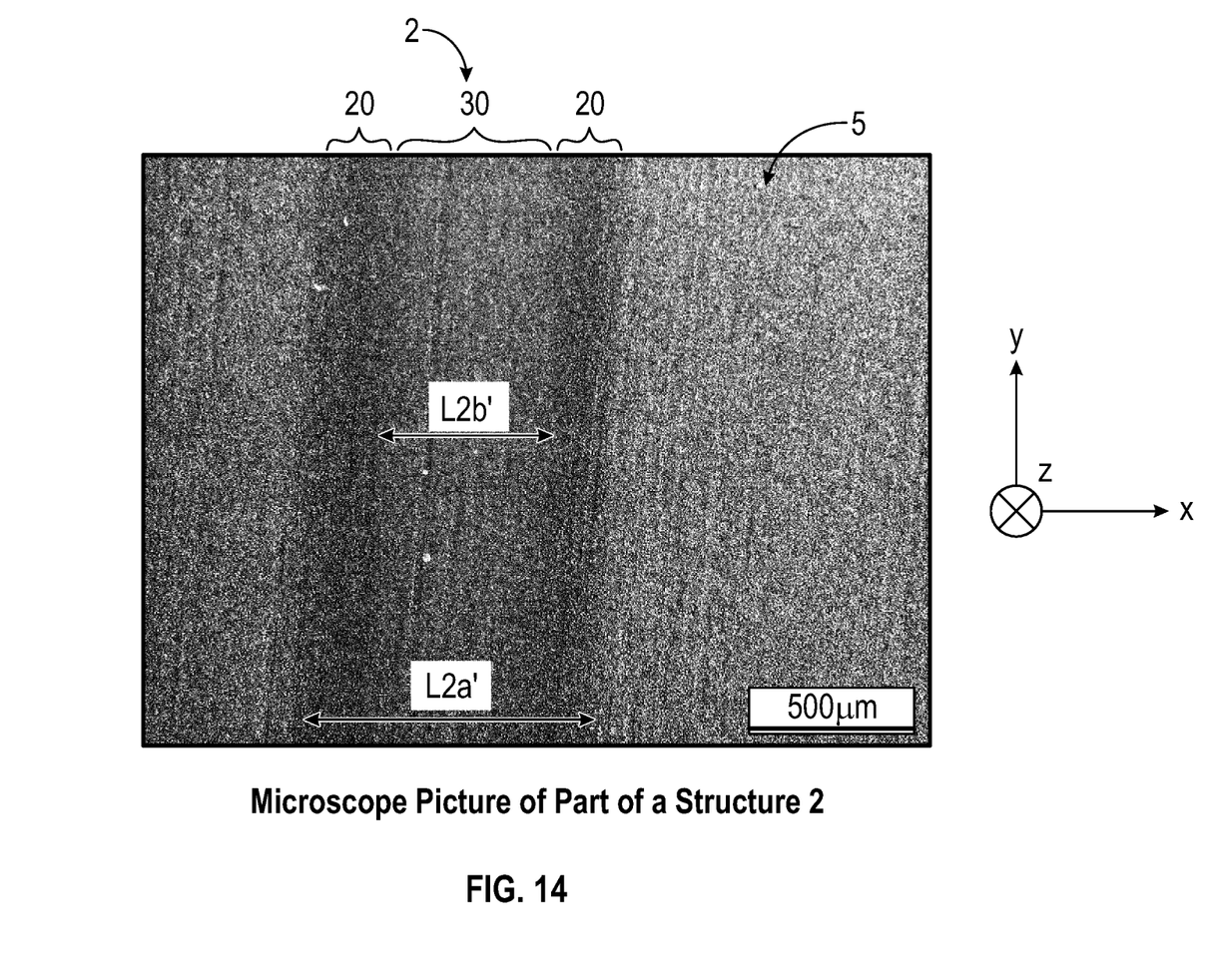
FIG. 14 shows an microscope image of a detail of a charge collecting structure before the deposition of a second nano-crystalline silicon layer.

An enlarged view is illustrated in FIG. 13 and the energy levels at the contact zone 30 and separation zones 20 are illustrated in respectively FIGS. 11 and 12. When providing a wider buffer layer 2a made of, for example, n-doped amorphous silicon before the deposition of a less-wider n-doped nano-crystalline layer 2b, the separation zone 20 around the contact structure 2' includes a standard P-N (non-tunnel) diode made of a-Si:H(n) layer and nc-Si:H(p) layer as shown in FIG. 12. This diode behaves like a typical P-N diode with a built-in electrical field in the depletion region. This field effect prevents the electron and hole charges to recombine at the edge of the fingers over a predetermined length, defined as the length of a vertical cross section of said separation zone 20, as illustrated in FIG. 2. These separating zones 20 guarantee a high shunt resistance between the different type contacts 10, 30 even when using a highly nano-crystalline layer 4. By the process of the invention, which is further described in the method section, a separation zone 20 is realized, preventing electron-hole recombination along the edges of contact structures 2 while the contacting zones 30 in the contact structures 2, including a tunnel diode, is merely located at the center area of the contact structures 2 where there is a direct contact between nano-crystalline layers 2b and the nano-crystalline layer 4, also illustrated in FIG. 11 in which the energy levels are illustrated schematically.

To demonstrate the surprising benefit of the present invention, the minority carrier lifetime measured with and without the wide a-Si(n) buffer layer 2a of the invention are summarized as follows:

the minority carrier lifetime after double side passivation with a-Si:H(i) layers, with or without a-Si(n) buffer 2a is 8000 µs;

the minority carrier lifetime after nano-crystalline (n) layer 2b deposited through a mask without a-Si(n) buffer 2a is 6650 µs, and is 8200 µs with a-Si(n) buffer;

the minority carrier lifetime after deposition of nano-crystalline (p) layer 4a without a-Si(n) buffer 2a is 400 µs, and is 7460 µs with a-Si(n) buffer.

The solar cell precursor is measured after depositing the double side a-si:H(i) layers, then again after depositing the nano-crystalline patterned layer 2b with and without patterned wider amorphous layer structures 2a, the individual wider amorphous structures 2a placed below the individual smaller structures 2b being centered to each other. A third measurement of the minority carrier lifetime is done after the deposition of the second nano-crystalline layer 4. Removing the wider layer structures 2a strongly degrades the minority carrier lifetime (i.e. to 400 µs) by internal recombination of carriers along the edges of structures 2, inhibiting IBC HJT devices to reach high efficiency, while inserting the wider amorphous layer structures 2a maintains the passivation at an excellent level (i.e. at 7460 µs).

Thus, the present invention presents a specific morphology of the electron finger, that provides a surprising effect, i.e. it provides a contact junction only on the center part of the contact structures 2 while along the edges of the contact structures 2 a lateral separation zone 20 presents an electrical barrier (in lateral direction), acting like an isolation zone, which prevents the recombination of the electrons-holes carriers. The length of the separation zone (typically 5 to 100 µm) can be modified by various means described below.

Figure 15:
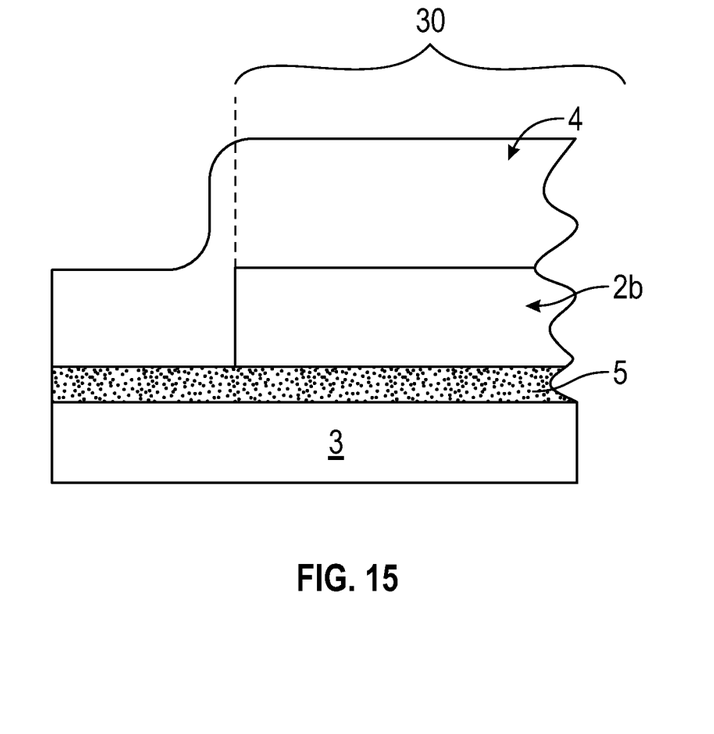
FIG. 15 illustrates a structure of prior art showing a contact zone including a tunnel junction contact between a first nano-crystalline layer 2b and a second nano-crystalline layer 4
Figure 16:
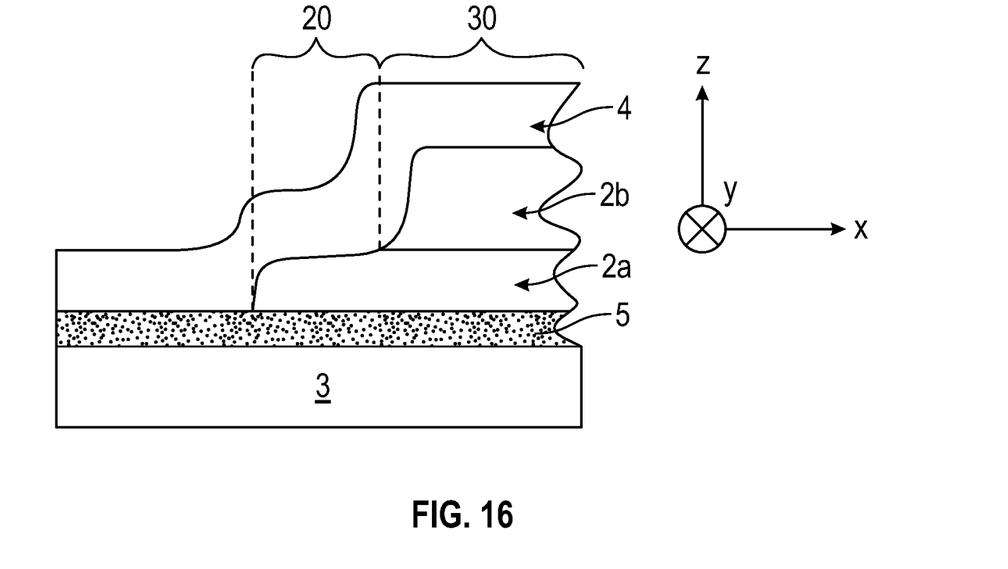
FIG. 16 illustrates a cross section of a charge collecting structure of the invention showing a contact zone including a tunnel junction contact between a first nano-crystalline layer 2b and a second nano-crystalline layer and showing a separation zone including a blocking contact between first amorphous layer 2a and a second nano-crystalline layer.
Figure 17:
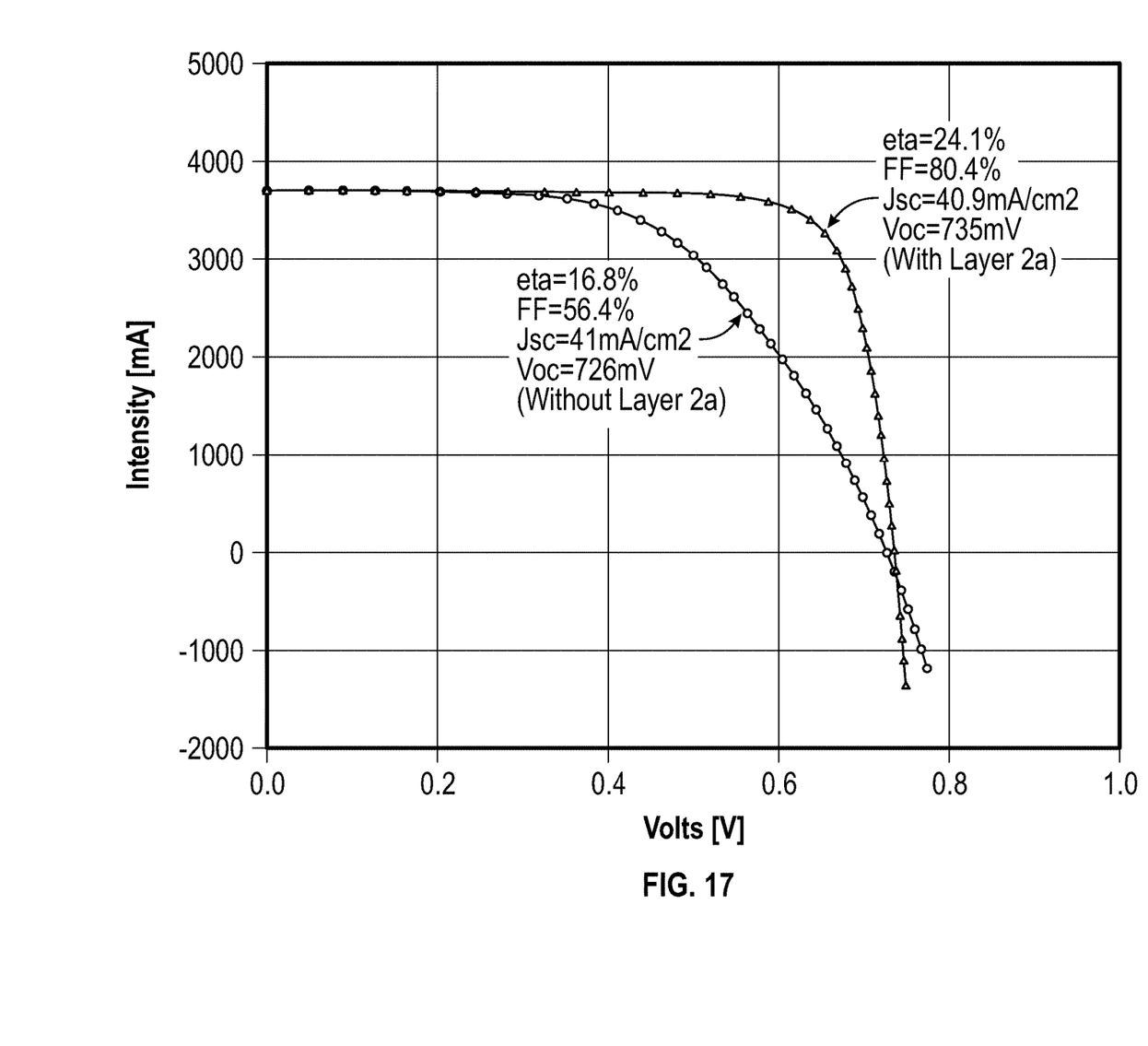
FIG. 17 illustrates IV curves (current-voltage curves) of finished IBC-HJT solar cells of the invention, including charge collecting structures with and without so called separation zones realized by depositing an additional larger amorphous layer.

The difference between the prior art structure described in the document EP3371833A1 and the charge collecting fingers of the invention is illustrated in FIG. 15 (structure of document EP3371833A1) and FIG. 16 (structure of the invention).

In FIG. 15 the electron contact structure has the same width along its thickness, with a layer material made of "n-type amorphous silicon or proto-crystalline silicon or nano-crystalline silicon or micro-crystalline silicon or any combination or stack of these layers or any alloys made of these layers (such as oxygen or carbon alloying)". When compared to prior art device of FIG. 15, the invention (FIG. 16) differs by inserting a dedicated n-doped amorphous layer which is larger than the nano-crystalline n-doped layers placed above. The part of layer 2a jutting out of layer 2b creates the separation zone 20 serving as an electrically isolating zone along the edges of contact structures 2 which does not exist in the prior art. This isolation zone prevents the recombination of electron and holes carriers at the edges of the contact structures 2 as presented before (Table 1).

In an embodiment said amorphous layer 2a is in direct contact, with said intrinsic amorphous a-Si:H(i) layer 5. In variants a further layer, not illustrated, may be deposited between layer 5 and the amorphous layer 2a.

In an embodiment, illustrated in FIG. 3, said width L2a of said amorphous layer portions 2a is preferably 10% larger, even more preferably 20% larger than said width L2b of said nano-crystalline layer 2b. In variants, the virtual projected area, in an X-Y plane of said amorphous layer portions 2a may be 5% larger, preferably 10% larger, even more preferably 20% larger than the virtual projected area, in an X-Y plane, of said at least partially nano-crystalline layer 2b. In an embodiment said amorphous layer 2a has a height Ha between 1 nm and 45 nm, preferably between 3 nm and 25 nm. The height H of said first charge collection portions 2' is typically between 25 nm and 100 nm.

In variants the amorphous layer 2a is preferably more than 80% amorphous and may comprise nano-crystals.

In a further variant of the inventions the first type patterned layer 2a can include oxygen, nitrogen or carbon.

In a further variant the second type patterned layer 2b can include oxygen, nitrogen or carbon.

In variants of execution the amorphous layer 2a and/or said second portions 2b may comprise oxygen (O) and/or carbon (C).

In a further variant the density of oxygen or carbon might be enhanced at the outer surface of layer 2a.

The invention is also achieved by a method for manufacturing of a photovoltaic device las described and comprises the steps (a-d) of:

a. providing a silicon-based substrate 3 having an n-type doping and comprising an intrinsic amorphous a-Si:H (i) layer 5 situated on said at least first face 3a;

b. realizing on predetermined areas 5a a first deposition of a n-type doped amorphous silicon layer 2a, c. realizing on each of said amorphous layer islands 2a a second deposition of a second nano-crystalline layer 2b having the same doping type as said amorphous layer 2a, said second deposition being different than said first deposition, so as to create on top of each of said amorphous layer islands 2a, said second nano-crystalline layer portions 2b forming with said amorphous layer islands 2a a plurality of charge collection portions 2', said amorphous layer portions 2a having, for any of its cross section parallel to said X-Y plane, a first projected area on said X-Y plane that is greater than a second projected area, on said X-Y plane, of said second nano-crystalline layer 2b;

d. realizing a single nano-crystalline silicon layer 4 on said charge collection portions 2' and on interstices 2" between said charge collection portions 2', said single nano-crystalline silicon layer 4 having a different doping type than the doping type of said charge collection portions 2'.

The term "wider" is defined as above, i.e. at least one width of the amorphous layer portions 2a is wider than the largest width of nano-crystalline layer portions 2b. In practical situations, as illustrated in FIGS. 2 to 9 the largest width of the amorphous layer portions 2a is the width at the contact with the buffer layer 5.

In an embodiment said amorphous silicon layer 2a and said n-type nano crystalline layer 2b is deposited by using the same mask.

In an embodiment said amorphous silicon layer 2a and said n-type nano-crystalline layer 2b is deposited by using a mechanical mask.

In an embodiment said amorphous silicon layer 2a and said n-type, or p-type, nano-crystalline layer 2b is deposited by using a mechanical mask made of INVAR or stainless steel.

In an embodiment the deposition of the amorphous silicon layer 2a and said nano crystalline layer 2b is made by using two different masks, said first deposition being made by using a first mask having larger openings than the second mask used said second deposition.

In an embodiment said first and second deposition steps are made by using the same mask and wherein during said first deposition the mask is not in contact with substrate 3 and wherein during said second deposition step the mask is in contact with said substrate leading to first charge collection portions 2' that comprise amorphous layer portions 2a that are wider than the nano-crystalline layer portions 2b on top of said amorphous layer portions 2a.

In an embodiment said first and second deposition steps are made using a single mask having openings with a design giving different sized patterns when using different type of deposition parameters. A mask design having a wider opening at the wafer contact surface and a narrower opening at the surface facing the deposition zone can lead to a pattern size that is strongly dependent on the plasma parameters chosen in the deposition process. The deposition parameters can vary for example in gas phase density, temperature, gas mixture, more or less directed precursor generation or a combination thereof.

The invention claimed is:

1. A photovoltaic device being an interdigitated back contact photovoltaic device comprising:
   a silicon-based substrate being of p-type or n-type doping and having a first face defining a X-Y plane;
   an intrinsic amorphous silicon layer a-Si:H(i) situated on said first face;
   a first patterned silicon layer situated on said intrinsic layer, said first silicon layer being of p-type or n-type doping,
   said first patterned silicon layer comprising interstices between charge collection portions, said charge collection portions comprising each second portions of an at least partially nano-crystalline silicon layer at their side away from said silicon-based substrate;
   a second nano-crystalline silicon layer being situated on said charge collection portions, and on said interstices, and having another type of doping than the doping type of said patterned silicon layer,
   wherein
   said charge collection portions comprise each an amorphous layer portion situated between said intrinsic layer and said second portions, said amorphous layer portions having, in at least one of its cross sections parallel to said X-Y plane, and in any radial direction, a largest width that is greater than any width of said second portions, said amorphous layer portions and said second portions being basically centered to each other.

2. The photovoltaic device according to claim 1 wherein said largest width of amorphous layer portions is at least 10% larger than said any width of said second portions.

3. The photovoltaic device according to claim 2, wherein said amorphous layer has a height between 1 nm and 25 nm, and wherein the height of said first charge collection portions is between 25 nm and 100 nm.

4. The photovoltaic device according to claim 2, wherein said first patterned silicon layer and/or said second nano-crystalline silicon layer includes oxygen and/or carbon.

5. The photovoltaic device according to claim 2, wherein said amorphous layer and/or said second portions comprise oxygen and/or carbon.

6. Photovoltaic device according to claim 2, wherein the said second nano-crystalline silicon layer has a crystalline phase above 50%.

7. The photovoltaic device according to claim 1, wherein said amorphous layer has a height between 1 nm and 25 nm, and wherein the height of said first charge collection portions is between 25 nm and 100 nm.

8. The photovoltaic device according to claim 7, wherein said first patterned silicon layer and/or said second nano-crystalline silicon layer includes oxygen and/or carbon.

9. The photovoltaic device according to claim 7, wherein said amorphous layer and/or said second portions comprise oxygen and/or carbon.

10. Photovoltaic device according to claim 7, wherein the said second nano-crystalline silicon layer has a crystalline phase above 50%.

11. The photovoltaic device according to claim 1, wherein said first patterned silicon layer and/or said second nano-crystalline silicon layer includes oxygen and/or carbon.

12. The photovoltaic device according to claim 11, wherein said amorphous layer and/or said second portions comprise oxygen and/or carbon.

13. The photovoltaic device according to claim 1, wherein said amorphous layer and/or said second portions comprise oxygen and/or carbon.

14. Photovoltaic device according to claim 1, wherein the said second nano-crystalline silicon layer has a crystalline phase above 50%.

15. Method for manufacturing of a photovoltaic device according to claim 1, comprising:
   a) providing a silicon-based substrate having an n-type or a p-type doping and comprising an intrinsic amorphous a-Si:H(i) layer situated on said first face;
   b) realizing on predetermined areas of said intrinsic layer, a first deposition of an n-type or p-type amorphous silicon layer, so as to create a patterned amorphous layer comprising a plurality of distinct and separated amorphous layer islands;
   c) realizing on each of said amorphous layer islands a second deposition of a second nano-crystalline layer having the same doping type as said amorphous layer, said second deposition being different than said first deposition, so as to create on top of each of said amorphous layer islands, said second nano-crystalline layer portions forming with said amorphous layer islands a plurality of charge collection portions, said amorphous layer portions having, for any cross section parallel to said X-Y plane, a first projected area on said X-Y plane that is greater than a second projected area, on said X-Y plane, of said second nano-crystalline layer;
   d) realizing a single nano-crystalline silicon layer on said charge collection portions and on interstices between said charge collection portions, said single nano-crystalline silicon layer having a different doping type than the doping type of said charge collection portions.

16. Method according to claim 15, wherein said amorphous silicon layer and said second nano-crystalline layer are both deposited by using the same mask.

17. Method according to claim 15, wherein the deposition of the amorphous silicon layer and said second nano-crystalline layer is made by using two different masks, said first deposition being made by using a first mask having larger openings than the second mask used said second deposition.

18. Method according to claim 15, wherein said first and second deposition steps are made by using the same mask and wherein during said first deposition the mask is not in contact with said substrate and wherein during said second deposition step the mask is in contact with said substrate providing first charge collection portions that comprise amorphous layer portions that are wider than said second nano-crystalline layer portions.

19. Method according to claim 15, wherein at least one mask to deposit said amorphous silicon layer and/or said second nano-crystalline layer is a mechanical mask made of INVAR or stainless steel.

20. Method according to claim 15, wherein said first and second deposition steps are made using a single mask having substantially conical openings to provide different sized patterns of said amorphous silicon layer and/or said second nano-crystalline layer when using different type of deposition parameters.

* * * * *